(12) United States Patent
Fujisawa et al.

(10) Patent No.: US 6,798,001 B2
(45) Date of Patent: Sep. 28, 2004

(54) SEMICONDUCTOR DEVICE HAVING PHOTO DIODE WITH SENSITIVITY TO LIGHT OF DIFFERENT WAVELENGTHS

(75) Inventors: Tomotaka Fujisawa, Tokyo (JP); Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/902,177

(22) Filed: Jul. 10, 2001

(65) Prior Publication Data

US 2002/0017655 A1 Feb. 14, 2002

(30) Foreign Application Priority Data

Jul. 11, 2000 (JP) .................................. P2000-209780

(51) Int. Cl.⁷ .................... H01L 31/062; H01L 31/113
(52) U.S. Cl. ................................ 257/292; 257/293
(58) Field of Search .............................. 257/292, 293, 257/296, 458

(56) References Cited

U.S. PATENT DOCUMENTS 5,500,550 A    3/1996   Morishita
5,886,374 A  * 3/1999   Sakamoto et al. .......... 257/292

FOREIGN PATENT DOCUMENTS

DE      197 58 355 A1   8/1998
EP      59004183        1/1984
EP      0 436 335 A2    7/1991
EP      0 944 117 A1    9/1999

OTHER PUBLICATIONS

Vera Gradisnik and Julijana Divkovic Puksec, "Color Detection Using a Capacitance of np Silicon Photodiode",10$^{th}$ Meditaerranean Electrotechnical Conference, MEleCon 2000, vol. ll.

* cited by examiner

*Primary Examiner*—Amir Zarabian
*Assistant Examiner*—Kiesha Rose
(74) *Attorney, Agent, or Firm*—Sonnenschein, Nath & Rosenthal LLP (57) ABSTRACT

A semiconductor device having a photo diode which has substantially the same sensitivity to a plurality of light having different wavelengths, includes a first and a second conductivity type semiconductor layer formed at a surface layer portion of the first conductivity type semiconductor layer, wherein the sensitivity to light of a first wavelength and a second wavelength which is different from the first wavelength, are made substantially the same by designing a region in which a depletion layer spreads from a junction of the first and second conductivity type semiconductor layers and when an inverse bias is applied to the first and second conductivity type semiconductor layers, for example, by designing it to spread in a region of 3 to 6 μm or a region of 2 to 7 μm from the surface of the second conductivity type semiconductor layer in the depth direction.

8 Claims, 5 Drawing Sheets

PRIOR ART

FIG.1A

PRIOR ART

SEMICONDUCTOR DEVICE HAVING PHOTO DIODE WITH SENSITIVITY TO LIGHT OF DIFFERENT WAVELENGTHS

RELATED APPLICATION DATA

The present invention claims priority to Japanese Application No. P2000-209780 filed Jul. 11, 2000, which application is incorporated herein by reference to the extent permitted by law.

BACKGROUND OF THE INVENTION

1. Field of the Invention

The present invention relates to a semiconductor device, more particularly relates to a semiconductor device having a photo diode for receiving a plurality of light having different wavelengths.

2. Description of the Related Art

Light receiving elements, that is, photodiodes, are being widely used as optical sensors for converting an optical signal to an electrical signal for control use in optical sensor applications in a variety of photoelectronic conversion apparatuses and for optical pickup applications installed in CD, DVD, and other optical disk drives.

There are several kinds of the above photo diode, but basically it is comprised of a pn junction of a semiconductor.

When applying an inverse bias to a pn junction, a depletion layer spreads in a p-type semiconductor region and an n-type semiconductor region, respectively, from a pn-junction surface. Electron-hole pairs are generated by light absorbed mainly in the depletion layer. The electrons move to the n-type semiconductor region drawn by the electric field, while the holes move to the p-type semiconductor region and are detected as a current.

Particularly, by providing an I layer (p$^-$-layer or n$^-$-layer) containing conductive impurities at a low concentration between the p-layer and n-layer, it is possible to have the depletion layer spread by a low voltage. This is called a PIN photo diode.

Figure 1A:
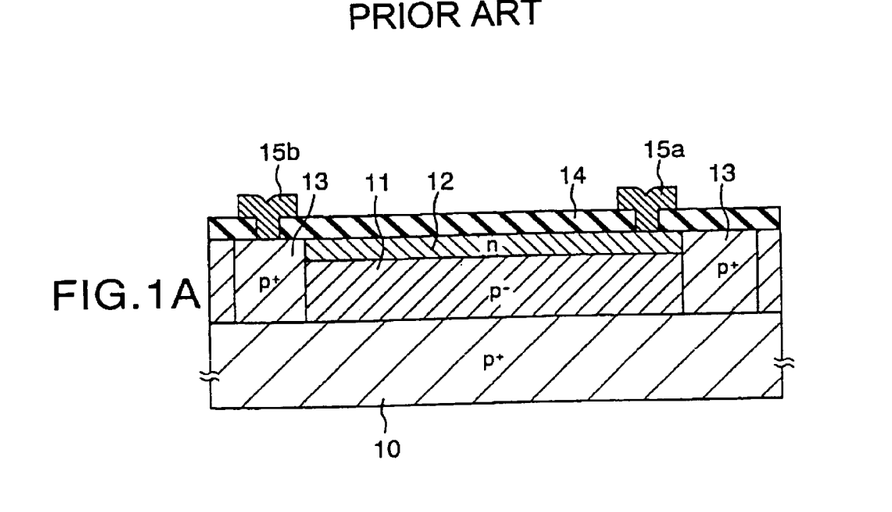
FIG. 1A is a sectional view of a PIN photo diode according to the related art.

FIG. 1A is a sectional view of the above PIN photo diode.

For example, a p$^-$-type semiconductor layer 11 is formed on the p$^+$-type semiconductor substrate 10, furthermore, an n-type semiconductor layer 12 is formed at a surface region of the p$^-$-type semiconductor layer 11 so that the pn junction is formed.

A p$^+$-type semiconductor layer 13 is formed to surround the PIN diode region. It becomes a take-out portion of a p-region and isolates the PIN diode region from other elements.

A protective insulating film 14 comprised of silicon oxide etc. is formed at an upper layer of the n-type semiconductor layer 12 and the p$^+$-type semiconductor layer 13. Contacts respectively reaching the n-type semiconductor layer 12 and the p$^+$-type semiconductor layer 13 are opened, and take-out electrodes (15$a$ and 15$b$) are formed.

Figure 1B:
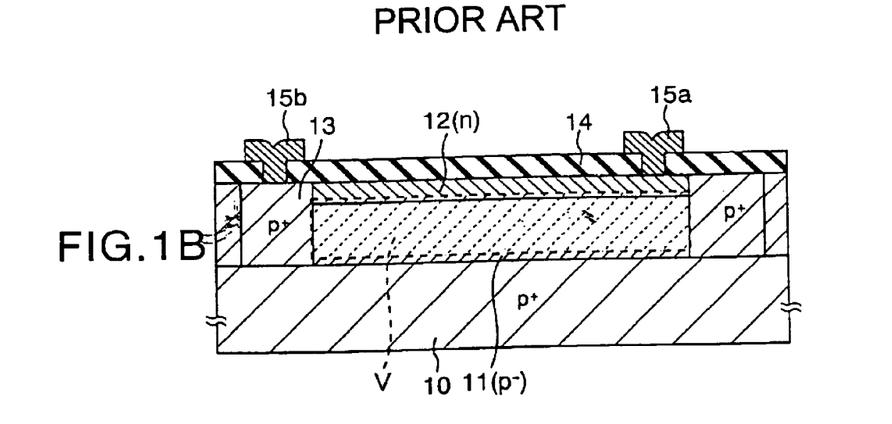
FIG. 1B is a view of the spread of a depletion layer when an inverse bias is applied to the PIN photo diode in FIG. 1A.

When applying a predetermined inverse bias to the pn-junction of the PIN photo diode shown in FIG. 1A, a depletion layer V spreads from the pn-junction surface to the directions of the p$^-$-type semiconductor layer 11 and n-type semiconductor layer 12 as shown in FIG. 1B.

Here, the depletion layer V spreads so that the total number of carriers becomes equal at the n-side and p-side, so spreads more to the p$^-$-type semiconductor layer 11 side having a low carrier concentration.

However, a photo diode such as the above conventional PIN photo diode is normally designed to be in a structure which is optimized for light having a certain wavelength, for example, near 780 nm when used in a CD system and near 650 nm when used in a DVD system. Generally, in a photo diode of the same structure, there is a large wavelength dependence of the light receiving sensitivity, so when trying to receive a plurality of light having different wavelengths such as light of wavelengths of 780 nm and 650 nm, by an identical photo diode or by a plurality of photo diodes of the same structure present on an identical substrate, the sensitivity ends up greatly differing at the different wavelengths. Thus, for practical use, it was necessary to make the sensitivities match in a required wavelength region.

The above wavelength dependence of the light receiving sensitivity is derived from the fact that the light receiving sensitivity differs in accordance with the laser wavelengths and the structure of the photo diode since when the reflection of light at the light receiving surface is 0%, the light receiving sensitivity $S=e\lambda/hc$ at a quantum efficiency of 100% stands, so the light receiving sensitivity at the quantum efficiency of 100% rises as the wavelength becomes longer in proportion to the wavelength, while the length of light absorption becomes shorter as the light wavelength becomes shorter.

SUMMARY OF THE INVENTION

An object of the present invention is to provide a semiconductor device having a photo diode having substantially the same sensitivity for a plurality of light of different wavelengths.

To achieve the above object, a semiconductor device of the present invention is a semiconductor device having a photo diode comprising a first conductivity type semiconductor layer and a second conductivity type semiconductor layer formed at a surface layer portion of said first conductivity type semiconductor layer, wherein the sensitivity of said photo diode to light of a first wavelength and the sensitivity to light of a second wavelength which is different from said first wavelength are made to become substantially the same by designing a region in which a depletion layer spreads from a junction surface of said first conductivity type semiconductor layer and said second conductivity type semiconductor layer when inverse biases are applied to said first conductivity type semiconductor layer and said second conductivity type semiconductor layer.

In the semiconductor device of the present invention, preferably the sensitivity of said photo diode to light of a first wavelength and the sensitivity to light of a second wavelength are made to become substantially the same by designing impurity concentrations and said inverse biases of said first conductivity type semiconductor layer and said second conductivity type semiconductor layer and by designing said region in which a depletion layer spreads.

Preferably, in the above semiconductor device of the present invention, the depletion layer is designed to spread in a region including a region 3 to 6 $\mu$m or 2 to 7 $\mu$m in the depth direction from a surface of the second conductivity type semiconductor layer.

Preferably, in the above semiconductor device of the present invention, the first conductivity type semiconductor layer is formed on a first conductivity type semiconductor substrate containing a first conductivity type impurity at a higher concentration than the first conductivity type semiconductor layer.

More preferably, the concentration of the first conductivity type impurity on the surface of the first conductivity type semiconductor substrate is at least $1\times10^{17}/cm^3$.

More preferably, a distance between an end face of said depletion layer on said first conductivity type semiconductor substrate side and the surface of said first conductivity type semiconductor substrate is 3 μm or less.

In the semiconductor device of the present invention, preferably said first wavelength is 780 nm and said second wavelength is 650 nm.

Furthermore, to achieve the above object, a semiconductor device of the present invention is a semiconductor device comprising a first conductivity type semiconductor substrate, a first conductivity type semiconductor layer formed on a first conductivity type semiconductor substrate and containing a first conductivity type impurity at a lower concentration than said first conductivity type semiconductor substrate, and a second conductivity type semiconductor layer formed at a surface layer portion of said first conductivity type semiconductor layer, wherein a photo diode is formed by spreading a depletion layer from a junction surface of said first conductivity type semiconductor layer and said second conductivity type semiconductor layer when inverse biases are applied to said first conductivity type semiconductor layer and said second conductivity type semiconductor layer, and the concentrations of the impurity of said first and second conductivity layers are adjusted so that the depletion layer spreading region is made wherein the sensitivity of said photo diode to light of a first wavelength and the sensitivity to light of a second wavelength which is different from said first wavelength become substantially the same.

The semiconductor device of the present invention is provided with a photo diode having a first conductivity type semiconductor layer and a second conductivity type semiconductor layer formed at a surface layer portion of said first conductivity type semiconductor layer, wherein the sensitivity to light of a first wavelength and the sensitivity to light of a second wavelength which is different from said first wavelength are made to become substantially the same by designing the impurity concentrations and said inverse biases of said first conductivity type semiconductor layer and said second conductivity type semiconductor layer, by designing a region in which a depletion layer spreads from a junction surface of said first conductivity type semiconductor layer and said second conductivity type semiconductor layer when inverse biases are applied to said first conductivity type semiconductor layer and said second conductivity type semiconductor layer, and, for example, by designing the depletion layer to spread to a region 3 to 6 μm or 2 to 7 μm in the depth direction from a surface of the second conductivity type semiconductor layer.

The semiconductor device having the above photo diode is a semiconductor device having a photo diode designed with a region in which a depletion layer spreads so that the sensitivity of the photo diode to light of a first wavelength and the sensitivity to light of a second wavelength which is different from said first wavelength become substantially the same and therefore having substantially the same extent of sensitivity to a plurality of light of different wavelengths.

The semiconductor device of the present invention may be made a PIN photo diode enabling the depletion layer to easily spread by a low voltage by forming the first conductivity type semiconductor layer on a first conductivity type semiconductor substrate containing a first conductivity type impurity in a higher concentration than the first conductivity type semiconductor layer.

In the above configuration, by making the surface concentration of the first conductivity type impurity of said first conductivity type semiconductor substrate at least $1 \times 10^{17}/$ cm$^3$ or by making the distance between an end face of said depletion layer at the first conductivity type semiconductor substrate side and the surface of said first conductivity type semiconductor substrate 3 μm or less, it is possible to suppress more than the necessary photoelectric conversion in the region below the depletion layer and improve the frequency characteristics to enable the speed of the device to be increased.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments of the present invention will be described with reference to the accompanying drawings.

Below, an embodiment of the present invention will be explained with reference to the drawings.

Figure 2A:
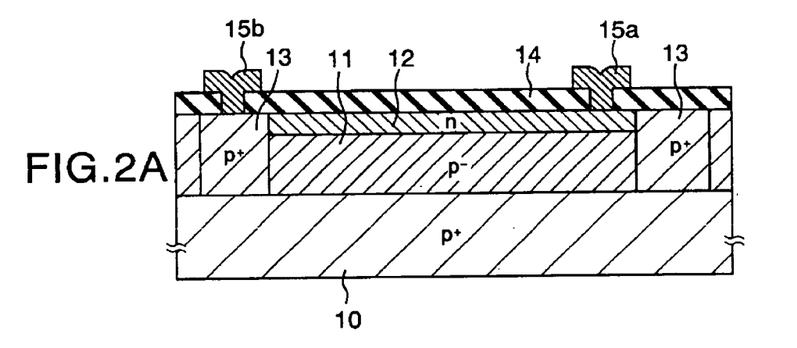
FIG. 2A is a sectional view of a PIN photo diode according to an embodiment of the present invention.

FIG. 2A is a sectional view of an Si-based PIN photo diode according to the present embodiment.

For example, a p$^-$-type silicon semiconductor layer 11 having an impurity concentration of about $5 \times 10^{13}/$cm$^3$ is formed on a p$^+$-type silicon semiconductor substrate 10 having an impurity concentration of about $1 \times 10^{17}$ to $1 \times 10^{19}/$cm$^3$ and, further, an n-type semiconductor layer 12 of about $10^{15}/$cm$^3$ is formed at the surface region of the p$^-$-type semiconductor layer 11, whereby a pn-junction is formed.

Also, a p$^+$-type semiconductor layer 13 is formed surrounding the PIN diode region. This becomes a take-out portion of a p-region and isolates the PIN diode region from other elements.

A protective insulating film 14 comprised of silicon oxide etc. is formed at an upper layer of the n-type semiconductor layer 12 and p$^+$-type semiconductor layer 13, contacts reaching respectively the n-type semiconductor layer 12 and the p$^+$-type semiconductor layer 13 are opened, and take-out electrodes (15a and 15b) comprised of polycrystalline silicon or other metals etc. are formed.

Figure 2B:
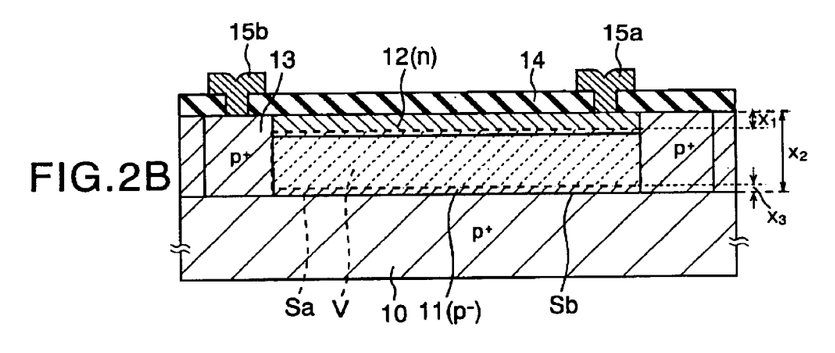
FIG. 2B is a view of the spread of a depletion layer when an inverse bias is applied to the PIN photo diode in FIG. 2A.

When applying a predetermined inverse bias of, for example, about 2.5V to the pn-junction of the PIN photo diode shown in FIG. 2A, the depletion layer V spreads to the directions of the p-type semiconductor layer 11 and n-type semiconductor layer from the pn-junction surface as shown in FIG. 2B.

Here, the depletion layer V spreads so that the total number of carriers becomes equal at the n-side and p-side, so spreads more to the p⁻-type semiconductor layer 11 side having a low carrier concentration.

A depth and width of the depletion layer V spreading when the above predetermined inverse bias is applied are designed so that the numbers of carriers generated by photoelectric conversion become equal for example for light of wavelengths of two different regions, that is, a wavelength region of 780 nm used for a CD system and a wavelength region of 650 nm used for a DVD system.

Namely, substantially the same extent of sensitivity and a high light receiving sensitivity is realized for a plurality of light having different wavelengths.

A method of design so that the numbers of carriers generated by photoelectric conversion become equal for a plurality of light having different wavelengths will be explained below taking as an example a case of the 780 nm wavelength range and 650 nm wavelength range.

Figure 3:
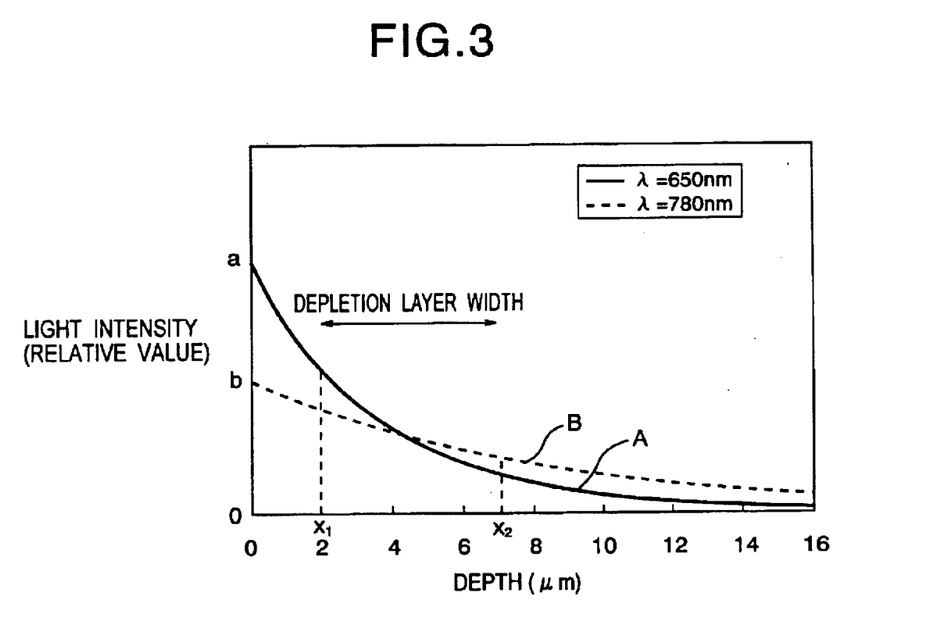
FIG. 3 is a view showing dependence on a depth of a light intensity (a relative value) by single wavelength light of 650 nm (A: solid line) and 780 nm (B: dotted line) entering silicon.

FIG. 3 shows the dependence on depth of a light intensity (relative value) of single wavelength light of 650 nm (A: solid line) and 780 nm (B: dotted line) entering the silicon.

In FIG. 3, the light intensity of 650 nm decreases in exponentially from a piece a, while the light intensity of 780 nm decreases from a piece b, respectively.

Namely, a light intensity $P_i$ at a depth x can be expressed by the following formula (1):

$$P_i = P_{i0} \cdot \exp(-\alpha x) \quad (1)$$

In the above formula (1), $P_{i0}$ is a light intensity at the silicon surface and becomes a value a by light having a wavelength of 650 nm and a value b by light having a wavelength of 780 nm.

Also, α is an absorption coefficient (specifically, it becomes $2.7 \times 10^3$/cm by light having a wavelength of 650 nm and $1.2 \times 10^3$/cm by light having a wavelength of 780 nm).

Based on the formula (1), when assuming that light absorbed in a range of depth $x_1$ to $x_2$ is all converted photoelectrically, the sensitivity $S(x_1, x_2)$ of the photo diode at the depths $x_1$ to $x_2$ is expressed by the following formula (2):

$$S(x_1, x_2) = P_{i0} \cdot \int_{x_1}^{x_2} \exp(-\alpha x) \cdot dx \quad (2)$$

$$= (P_{i0}/\alpha) \cdot [\exp(-\alpha x_1) - \exp(-\alpha x_2)]$$

When assuming the reflectance of the light reaching the silicon is 0% (a state of no reflection), formula (3) described below stands.

$$P_{i0}/\alpha = e\lambda/hc \quad (3)$$

Here, e indicates an elementary electric charge, λ a wavelength, h Planck's constant, and c the speed of light.

Based on the above formula (3), formula (2) is changed as follows:

$$S(x_1, x_2) = e\lambda/hc \cdot [\exp(-\alpha x_1) - \exp(-\alpha x_2)] \quad (4)$$

Here, by entering the above α value and setting $(x_1, x_2)$ as a parameter, the values of $S(x_1, x_2)$ at the time of light having a wavelength of λ=650 nm and λ=780 nm can be made substantially the same.

Accordingly, by designing an impurity concentration in the silicon and an inverse bias to be applied so as to be able to deplete the above obtained region of the depth $x_1$ to $x_2$, the numbers of carriers generated by photoelectric conversion of the light having wavelengths of 650 nm and 780 nm, that is, sensitivity to the 650 nm light and sensitivity to the 780 nm light, can be made substantially the same.

Referring to FIG. 3, an area of a region surrounded by an x-axis, a dotted line extending vertically from $x_2$ to the x-axis, and a light intensity curve (A, B) in FIG. 3 is the light receiving sensitivity between the depth $x_1$ to $x_2$ at the respective wavelengths.

For example, when assuming $x_1 = 2$ μm and $x_2 = 7$ μm, formulae described below stand.

$$S(x_1, x_2)(\lambda = 650 \text{ nm}) = 0.224 \text{ A/W}$$

$$S(x_1, x_2)(\lambda = 780 \text{ nm}) = 0.219 \text{ A/W}$$

The sensitivities to the 650 nm light and the 780 nm light can be made substantially the same.

Also, by setting $x_1 = 3$ μm and $x_2 = 6$ μm, the sensitivities to the 650 nm light and the 780 nm light can be made substantially the same in the same way.

The light entering regions other than the above depletion layer also contributes to the sensitivity of the photo diode, but when the photoelectric conversion rate of the light entering the depletion layer is the highest and conversely light enters regions of high impurity concentration other than the depletion layer, the possibility of recombination immediately after the conversion to carriers (separation of electrons and holes) becomes high and the photoelectric conversion rate becomes low.

When the light enters regions of a low impurity concentration (I region, such as, p⁻ region or n⁻ region) other than the depletion layer, although the possibility of recombination immediately after the conversion to carriers (separation to electrons and holes) is not high, the resistance to the carrier becomes high due to the low impurity concentration, so the frequency characteristics of the photo diode become poor and a higher speed cannot be obtained.

Accordingly, in FIG. 2B, it is prefrable to use as a semiconductor substrate 10, a substrate with a surface concentration of the p-type Impurity of at least $1 \times 10^{17}$/cm³, and to bring an end face $S_a$ of the depletion layer V on the semiconductor substrate 10 side and the surface $S_b$ of the semiconductor substrate 10 closer to a predetermined distance or less (for example 3 μm or less). By doing so, carriers generated in thin regions of the low impurity concentration other than the depletion layer are reduced, the frequency characteristics of the photo diode are improved, and a high speed can be obtained.

Also, carriers formed by the light entering regions within a diffusion length from the depletion layer are photoelectrically converted at a high probability. Furthermore, as is understood from FIG. 3, the longer the wavelength of the light, the deeper the light intensity is maintained. Thus, by bringing the end face $S_a$ of the depletion layer V on the semiconductor substrate 10 side and the surface $S_b$ of the semiconductor substrate 10 closer to a predetermined distance or less as explained above, it is possible to prevent excessive photoelectric conversion when the light on the long wavelength side (for example, 780 nm region with respect to 650 nm region) enters below the depletion layer so as to make the sensitivity the same as the light receiving sensitivity for the 650 nm region.

The above can be also applied to both the cases where the region of a low impurity concentration (I region) is a p⁻-region or n⁻-region.

As explained above, in an Si-based PIN photo diode according to the present embodiment, the depth and width of the depletion layer V at the time that a predetermined inverse bias is applied are controlled so that the numbers of carriers generated by photoelectric conversion become the same for two types of light having different wavelengths, for example, a region of 780 nm wavelength used in a CD system and a region of 650 nm wavelength used in a DVD system, so the diode has substantially the same sensitivity for a plurality of light having different wavelengths of the 780 nm region and 650 nm region.

EXAMPLES

A p⁻(I)-type silicon semiconductor layer 11 containing a p-type impurity of a low concentration of about $5\times10^{13}/cm^3$ was formed by normal epitaxial growth on a p⁺-type silicon semiconductor substrate 10 having a p-type impurity concentration of $1\times10^{18}/cm^3$ and an n-type semiconductor layer 12 containing an n-type impurity of about $5\times10^{15}/cm^3$ was formed on the p-type semiconductor layer 11, whereby a PIN photo diode having a pn-junction was formed.

An impurity profile in the direction of the depth of the PIN photo diode formed as explained above is shown in FIG. 4.

Figure 4:
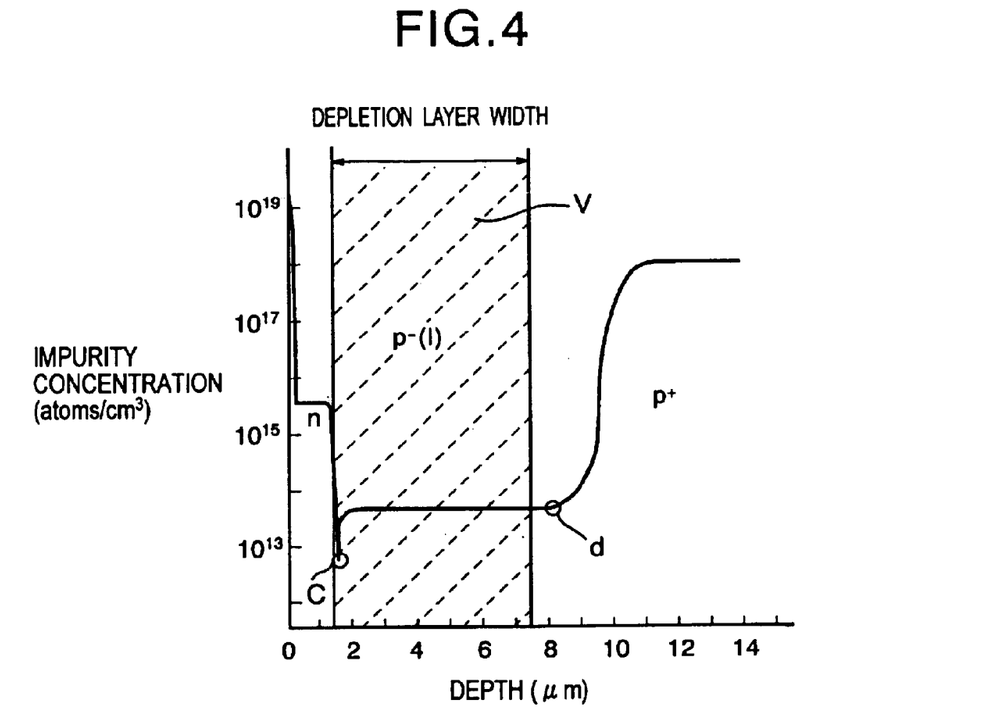
FIG. 4 shows the impurity profile in a depth direction of a PIN photo diode according to an embodiment of the present invention.

A pn-junction is formed at a region c of the depth of about 1.5 μm from the surface. A point d, where the p-type impurity concentration starts to rise from the p⁻(I)-type layer is formed at a depth of about 8 to 9 μm from the surface.

When an inverse bias of 2.5V is applied to the PIN photo diode having the above configuration, a depletion layer V spreads in a region including a region of the depth of about 2 to 7 μm as shown in FIG. 4.

Also, the distance from an end face of the depletion layer V on the substrate side to a point where the p-type impurity concentration starts to rise (corresponding to a distance between the end face of depletion layer on the substrate side and the substrate surface) can be set to be 3 μm or less.

The results of measurement of the dependence on the wavelength of the incident light of the light receiving sensitivity of the PIN photo diode formed as explained above are shown in FIG. 5. A curve e in the figure indicates the dependence on the wavelength of the incident light of the light receiving sensitivity. In the figure, a solid line f indicating an ideal dependence on the wavelength of the incident light of light receiving sensitivity in the case where the quantum efficiency is 100% is also shown.

Figure 5:
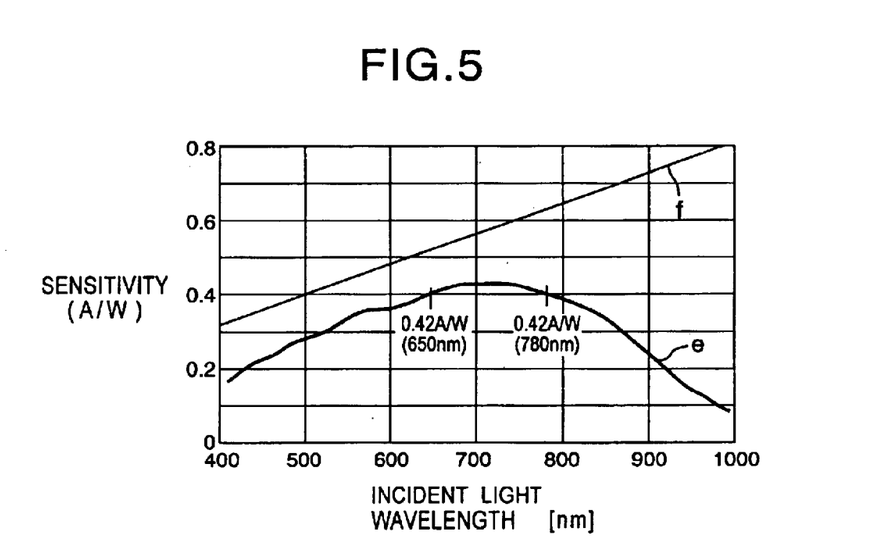
FIG. 5 is a view of the dependence on the wavelength of incident light of the sensitivity of a PIN photo dIode according to an embodiment of the present invention.

From FIG. 5, the light receiving sensitivities of the PIN photo diode formed as explained above in the cases of 650 nm and 780 nm are both about 0.42 A/W, that is, about the same sensitivity.

Namely, by designing a position and the width in the depth direction of the depletion layer region to be as above and by sharply raising the impurity concentration in a deeper portion than the lower end of the depletion layer, it became possible to lower the photoelectric conversion efficiency of light entering the portion deeper than the depletion layer and to make the light receiving sensitivity at 650 nm and 780 nm about the same.

A semiconductor device comprising a photo diode according to the above present embodiment can be preferably used as a light receiving element in an optical disk drive installed a dual CD/DVD system in.

The present invention is not limited to the above example.

For example, the p-type impurity and the n-type impurity can be switched in the above example, that is, the invention can be applied to a PIN photo diode having a p-type semiconductor region at a surface layer portion of an n⁻-type semiconductor region.

Also, the wavelengths for which the sensitivities are designed to be the same are not limited to 650 nm and 780 nm. It is also possible to design the sensitivities to be the same for one of 650 nm or 780 nm and wavelength used in optical disk drives other than CD or DVD systems.

Also, the invention is not limited to a PIN photo diode and may be applied to photo diodes in general.

In addition to the above, a variety of modifications can be made within the scope of the present invention.

The semiconductor device of the present invention has a photo diode designed so that a depletion layer spreads to a predetermined region so that the sensitivity of the photo diode to light of a first wavelength (for example, 780 nm) and sensitivity to light of a second wavelength (for example 650 nm) which is different from the first wavelength become substantially the same and therefore has substantially the same sensitivity to a plurality of light having different wavelengths.

Note that the present invention is not limited to the above embodiments and includes modifications within the scope of the claims.

What is claimed is:

1. A semiconductor device having a photo diode comprising:

a first conductivity type first semiconductor layer;

a first conductivity type second semiconductor layer disposed on said first conductivity type first semiconductor layer; and a second conductivity type semiconductor layer formed at a surface layer portion of said first conductivity type second semiconductor layer;

wherein said first conductivity type first semiconductor layer comprises a surface impurity concentration greater than that of said first conductivity type second semiconductor layer; and wherein when an inverse bias of a predetermined amount is applied to a junction of said first conductivity type second semiconductor layer and said second conductivity type semiconductor layer, a depletion layer is spread to a region between a first predetermined amount and a second predetermined amount in a depth direction from a surface of said second conductivity type semiconductor layer, such that a sensitivity of said photo diode to light of a first wavelength and a sensitivity of light of second wavelength, which is different from said first wavelength, are made substantially the same.

2. A semiconductor device as set forth in claim 1, wherein the first predetermined amount is 3 μm and the second predetermined amount is 6 μm.

3. A semiconductor device as set forth in claim 1, wherein the first predetermined amount is 2 μm and said second predetermined amount is 7 μm.

4. A semiconductor device as set forth in claim 1, wherein said first conductivity type first semiconductor layer is a first conductivity type substrate, and the surface impurity concentration of said first conductivity type substrate is at least $1\times10^{17}/cm^3$.

5. A semiconductor device as set forth in claim 1, wherein the first wavelength is 780 nm and the second wavelength is 650 nm.

6. A semiconductor device as set forth in claim 1, wherein the predetermined amount of bias applied is about 2.5V.

7. A semiconductor device having a photo diode comprising:
   a three layer structure including:
      a p-type semiconductor substrate having a surface impurity concentration ranging from about $1\times10^{17}/\text{cm}^3$ to $1\times10^{19}/\text{cm}^3$;
      a p-type semiconductor layer having an impurity concentration of about $5\times10^{13}/\text{cm}^3$ and formed on said p-type semiconductor substrate; and
      an n-type semiconductor layer having an impurity concentration of about $1\times10^{15}/\text{cm}^3$ and formed on said p-type semiconductor layer;
      wherein an end face of a depletion layer on a side of said p-type semiconductor substrate and a surface layer of said p-type semiconductor layer are within no more than a predetermined distance when inverse biases are applied to said p-type semiconductor layer and said n-type semiconductor layer, such that a sensitivity of said photo diode to light of a first wavelength and a sensitivity of light of a second wavelength, which is different from said first wavelength, are made substantially the same.

8. A semiconductor device having a photo diode comprising:
   a first conductivity type first semiconductor layer;
   a first conductivity type second semiconductor layer disposed on said first conductivity type first semiconductor layer; and
   a second conductivity type semiconductor layer formed at a surface layer portion of said first conductivity type second semiconductor layer;
   wherein said first conductivity type first semiconductor layer comprises a surface impurity concentration greater than that of said first conductivity type second semiconductor layer; and
   wherein when inverse biases are applied to said first conductivity type second semiconductor layer and said second conductivity type semiconductor layer, an end face of a depletion layer on a side of said first conductivity type first semiconductor layer, and a surface layer of said first conductivity type first semiconductor layer are brought within no more than $3\,\mu\text{m}$, forming a space layer, such that a sensitivity of the photo diode to light of a first wavelength and a sensitivity of light of a second wavelength, which is different from the first wavelength, are made substantially the same.

* * * * *